United States Patent [19]

Bluzer

[11] Patent Number: 5,179,072
[45] Date of Patent: Jan. 12, 1993

[54] MULTISPECTRAL SUPERCONDUCTIVE QUANTUM DETECTOR

[75] Inventor: Nathan Bluzer, Rockville, Md.

[73] Assignee: Westinghouse Electric Corp., Pittsburgh, Pa.

[21] Appl. No.: 624,784

[22] Filed: Dec. 10, 1990

[51] Int. Cl.⁵ .............. H01L 39/22; H01L 27/18; H01L 39/00; H01B 12/00
[52] U.S. Cl. .............. 505/1; 250/336.2; 257/33
[58] Field of Search .............. 250/336.2; 505/849, 505/1; 357/4, 5

[56] References Cited

U.S. PATENT DOCUMENTS

| | | | |
|---|---|---|---|
| 3,193,685 | 7/1965 | Burstein | 250/336.2 |
| 4,869,598 | 9/1989 | McDonald | 250/336.2 |
| 4,873,443 | 10/1989 | Schneider | 505/849 |
| 4,962,316 | 10/1990 | Jack | 250/336.2 |
| 4,970,395 | 11/1990 | Kruse, Jr. | 505/849 |
| 4,978,853 | 12/1990 | Hilal | 505/849 |
| 5,021,658 | 6/1991 | Bluzer | 250/336.2 |
| 5,051,787 | 9/1991 | Hasegawa | 357/5 |

*Primary Examiner*—Jerome Jackson, Jr.
*Assistant Examiner*—Daniel N. Russell
*Attorney, Agent, or Firm*—W. G. Sutcliff

[57] ABSTRACT

A multispectural superconductive quantum radiant energy detector and related method utilizing a closed loop of superconductive material having spaced legs, one of which is disposed to ambient. The superconductivity current is divided in the first and second legs according to geometric and kinetic inductances. A ground plane is provided for minimizing the geometric inductance with the loop during injection and removal of the current.

12 Claims, 4 Drawing Sheets

MULTISPECTRAL SUPERCONDUCTIVE QUANTUM DETECTOR

BACKGROUND OF THE INVENTION

1. Related Application

U.S. patent application entitled "Superconducting Infrared Detector" U.S. Pat. No. 5,021,658 filed on Jun. 29, 1989.

2. Technical Field

The present invention relates to radiant energy detectors; and more particularly, to multispectral superconductive quantum detectors and related method of detection.

3. Background Art

Superconductivity is defined as the absence of electrical resistance and the expulsion of a magnetic field, i.e., the Meissner effect. The superconducting phenomenon occurs at cryogenic temperatures in the neighborhood of 125° Kelvin or less, for example, when using the high temperature, well known superconductors, such as ceramic oxides, which are generally understood to be copper oxides, including but not limited to $YBa_2Cu_3O_7$ $La_{2-x}Ba_xCuO_4$, LaSrCuO, BiSrCaCuO, TlBaCaCuO. Also included is BaKBiO and the low temperature elemental and compound superconductors such as Nb, Pb, NbN, $Nb_3S_n$, and $Nb_3Ge$, for example. Whenever the term superconductor(s), superconductive, superconducting material, or the like is used in this application, it shall mean any material that is capable of becoming superconducting, regardless of the temperature, and regardless of whether such material has yet been identified.

Such superconductive material may take several forms including a thin film. The temperature at which a material actually becomes superconducting is referred to as the superconducting transition or critical temperature $(T_c)$. The amount of superconducting current that a particular superconductor can carry is referred to as the critical current density $(J_c)$.

Superconducting current is composed of and transported by bound pairs of electrons referred to as Cooper pairs. The binding energy between "Cooper" pair electrons is commonly termed the order parameter or the superconducting energy gap. Coherence length is a measure of the distance within which the order parameter changes drastically in a spatially varying magnetic field. The Cooper pair condensate is represented as a wave function with an amplitude, and a phase, reflecting the phase coherence of the Cooper pairs. In a superconductor, this amplitude and phase coherence are maintained over macroscopic distances or coherence lengths. If all the Cooper pairs are broken in a certain portion, which extend completely across the width and thickness of the superconductor, the material becomes resistive and exhibits a resistance.

The lack of phase coherence across normal or insulating regions is used to make circuit elements commonly referred to as Josephson Junctions, which includes weak links and tunneling junctions. These devices can be assembled into circuits known as superconductor quantum interference devices (SQUID). A weak link may be fabricated by connecting two superconductors with; a thin normal metal, or a constriction made up of a short superconductor section of narrow width, or a superconductor above its transition temperature. A tunneling junction is formed by a tunneling oxide layer, for example. In these examples, the phase of the superconducting current can change across a weak link, since, phase coherence is no longer maintained.

Basically there are two general types of radiant energy detectors; namely, thermal detectors and quantum detectors. A thermal detector, which is sometimes referred to as a bolometer is in effect a very sensitive thermometer whose electrical resistance, for example, varies with temperature; and which is used in the detection and measurement of absorbed thermal radiation energy. A quantum detector changes its electronic characteristics without significant lattice heating in accordance with the radiant flux absorbed by the detector.

Since superconducting materials exhibit a small energy gap, and thus are capable of photoabsorbing long wavelength photons, twenty to thirty microns for example, a great deal of interest has been generated in applying superconductivity to very long wavelength quantum detectors.

Heretofore, superconducting radiant energy detectors have made use of weak links or bolometric structures to detect the intensity of photons or radiant energy. The bolometric devices make use of lattice heating which produces a large change in resistance at the critical temperature. Bolometric detectors are significantly less sensitive (a thousand fold) than quantum (nonequilibrium) detectors, since the noise in bolometric detectors is higher than in quantum detectors.

Conventionally, the typical approach to superconducting quantum detectors is based on the utilization of weak links. However, the formation of weak links in high temperature superconductors in a controlled manner is difficult to achieve. This occurs because the material and processing technology in high temperature superconductors is immature and also because the coherence length in high temperature superconductors is very short. In view of the very short (less than 15 Angstroms) coherence length in high $T_c$ superconductors, the surface conditions at the boundary between the superconductor and the weak link become even more important.

Thus, for example, the tunneling layer thickness needs to be thinner in high temperature superconductors than a corresponding layer in lower temperature superconductors. This combination of the need for very thin tunneling layers and insufficient control of the metallurgical interphase between the superconductor material and the tunneling layer dielectric typically results in unrealizable Josephson Junctions.

Also, detectors based upon weak links are very low in area efficiency. A detector should span as much of the photon receiving pixel area as possible if good quantum efficiency is to be achieved. However, weak links inherently occupy only a very small area relative to a detector pixel size (50×50 microns). Hence, many weak links would be required in order to fill such a pixel area. This requirement would impose severe constraints in the manufacture of high quantum yield detectors that are based on Josephson junctions, i.e. weak links or tunneling junctions.

Another difficulty in the utilization of weak links is the expected signal. In achieving a maximum response, the life time of any photo excitation should be maximized. For maximum quasi particle life time, a maximum order parameter is required. The order parameter decreases with increased current, increased magnetic field (H), increase in operating temperature, and interface defects between superconductors and weak link material. High critical temperature superconducting weak link detectors require operating the weak links above or at critical current, which is a condition inconsistent with long quasi particle life time and a maximum order parameter. Thus, the response of such a detector will degrade because of the shorter lifetime expected under such operating conditions. Also, the issue of noise in the resistive state is a large detractor of the weak link approach.

DISCLOSURE OF THE INVENTION

One of the principle objects of the present invention is to provide a superconducting radiation detector that overcomes the disadvantages of previously proposed detectors.

Another object of the present invention is to provide a multispectral quantum superconducting detector that is simple in structure.

Still another object of the present invention is to provide a superconducting quantum detector that provides maximum response and low noise.

A further object of the present invention is to provide a superconductive detector having a maximized order parameter in that it may operate in a low magnetic field, and a low operating current.

A still further object of the present invention is to provide a superconductive quantum detector that does not utilize any weak links or Josephson tunneling junctions in the actual quantum response to the radiant energy.

Additional objects and advantages of the invention will be set forth in part in the description which follows; and in part will be obvious from the description, or may be learned by practice of the invention.

The objects and advantages of the invention may be realized and attained by means of the instrumentalities and combinations particularly pointed out in the appended claims.

To achieve the objects and in accordance with the purpose of the invention, as embodied and broadly described herein, a method for the quantum detection of multispectral radiant energy comprises providing at least one closed loop of superconductive material having spaced first and second legs with one of the first and second legs being exposed to ambient for sensing a photon signal, injecting and removing superconducting current at opposite ends of the loop, the current being divided according to geometric and kinetic inductances, the superconducting current in the first and second legs having a predetermined current ratio without exposure to photon radiant flux; and detecting a change in the kinetic inductance of the superconducting loop in accordance with intensity of the radiant photon flux striking the exposed leg.

In a more specific aspect, the present invention also preferably provides for minimizing the geometric inductance in the quantum detector superconductor loop.

In another aspect, the present invention provides a superconductive quantum multispectral detector comprising a substrate, a first thin film strip of superconductive material overlaying the substrate and having opposite ends defining a predetermined length; a second thin film strip of superconductive material having a central portion spaced from a central portion of the first strip and having opposite ends integrally attached to the opposite ends of the first strip defining first and second respective legs of a closed superconductive loop, the second leg of the closed loop being exposed to ambient; and read-out means inductively coupled to the defined loop for detecting an induced magnetic field corresponding to the intensity of photon radiation flux striking the second leg of the defined loop.

In a more specific aspect of the present invention, means are associated with the defined loop for minimizing geometric inductance therein.

The accompanying drawings, which are incorporated in and constitute a part of this specification illustrate embodiments of the invention; and together with the description serve to explain the principles of the invention.

BEST MODE FOR CARRYING OUT THE INVENTION

Reference will now be made in detail to the present preferred embodiments of the invention, examples of which are illustrated in the accompanying drawings.

According to the present invention, a method for the quantum detection of multispectral radiant energy comprises providing at least one closed loop of superconducting material having spaced first and second legs with one of the first and second legs being exposed to ambient for sensing a photon signal.

Figure 1:
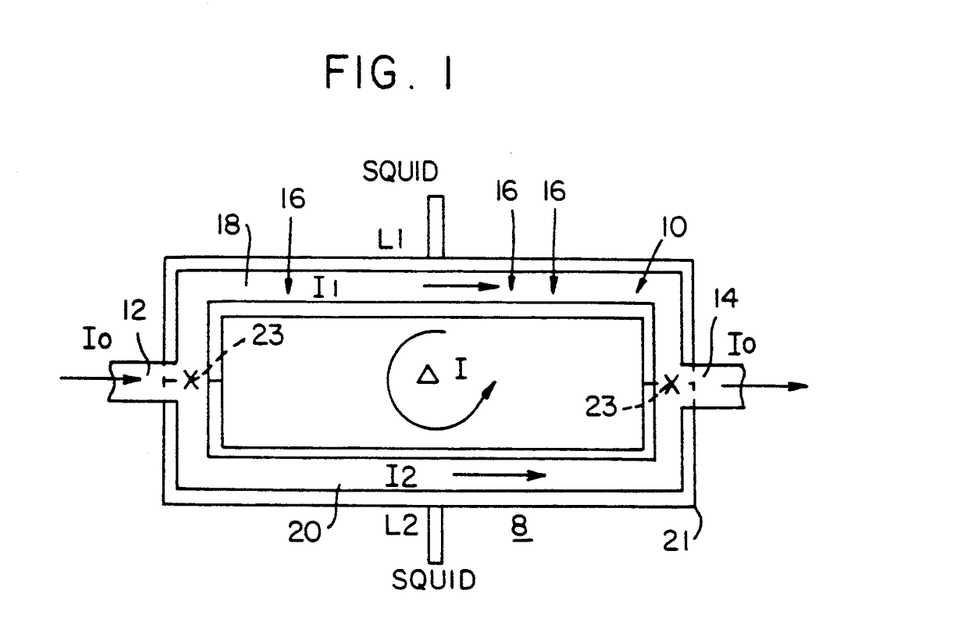
FIG. 1 is a diagram of one embodiment of a superconducting quantum detector in accordance with the principles of the present invention.

As herein embodied, and referring to FIG. 1, a detector, generally referred to as 8, includes a superconductor in the form of a loop 10 having first leg 18 spaced from leg 20. Loop 10 is made entirely from a superconducting material.

The method of the present invention includes injecting and removing superconducting current at opposite ends of the loop, respectively, each leg of the loop having a kinetic inductance in the superconducting state, the first and second legs having a predetermined current ratio without exposure to photon flux.

As herein embodied, and at a temperature no higher than the critical temperature for the material utilized, a current ($I_o$) no greater than the critical current is injected and removed from respective opposite ends of loop 10 at input/output ends 12 and 14. Detector 8 is so constructed that radiant photon flux represented by arrows 16 will be able to strike leg 18 of loop 10, but will not be able to strike leg 20 of loop 10. In the absence of any radiant photon flux striking leg 18, current $I_o$ is preferably divided equally in legs 18 and 20 represented as $I_1$ and $I_2$ respectively. This division is for optimal performance. However, other divisions of current between the legs of the loop are also viable for carrying out the method of the present invention. No weak links are included in loop 10; and division of current $I_o$ into $I_1$ and $I_2$ is such as to minimize the total magnetic energy stored in the detector. The magnetic Energy functional (E) of the superconducting detector of the present invention can be expressed as the sum of the magnetic field energy and energy contained as the kinetic inertia in the current transported by the Cooper pairs flowing in each leg of superconductive loop 10. The magnetic field energy expressed in terms of the geometrical inductance $L_1$ and $L_2$ of each leg 18 and 20 respectively, of loop 10 of FIG. 1 may be expressed as follows:

$(\frac{1}{2})L_1I_1^2$ for leg 18

$(\frac{1}{2})L_2I_2^2$ for leg 20  (1)

In a superconductor, because of an energy gap $\Delta$, super current persists since phonon scattering is inhibited for phonons with energy less than $\Delta$. The persistent current contributes additional terms to the magnetic energy functional (E). The additional terms reflect the kinetic energy associated with the mass of the flowing Cooper pairs carring the current, $I_1$ and $I_2$, and can be expressed in terms of the volume density of the number of paired carriers $N_1$ and $N_2$ in each branch or leg 18 and 20, respectively, and the corresponding carrier velocities $V_1$ and $V_2$ in the corresponding branches, and the length (l) and the cross sectional area (A) of each branch as follows:

$(\frac{1}{2})N_1mV_1^2$ Al for leg 18

$(\frac{1}{2})N_2mV_2^2$ Al for leg 20  (2)

where the variable m refers to the Cooper pairs effective mass. Kinetic energy of superconductive current expressed as $\frac{1}{2}MV^2$ be expressed as energy stored in kinetic inductance $\frac{1}{2}KI^2$. Recasting these expressions in terms of a Kinetic Inductance $K_1$, $K_2$ corresponding to legs 18 and 20 respectively, the expressions above become:

$(\frac{1}{2})K_1I_1^2$ where $K_1 = \frac{ml}{N_1q^2A}$ for leg 18  (3)

$(\frac{1}{2})K_2I_2^2$ where $K_2 = \frac{ml}{N_2q^2A}$ for leg 20

The variable (q) refers to the Cooper pairs electronic charge. Thus, the energy functional E of the superconducting loop of FIG. 1 can be expressed as $E = \frac{1}{2}L_1I_1^2 + \frac{1}{2}L_2I_2^2 + \frac{1}{2}K_1I_1^2 + \frac{1}{2}K_2I_2^2$  (4)

Minimizing the energy functional E with respect to $I_1$ or $I_2$ we obtain:

$\frac{(\partial E)}{(\partial I)} = 0 = L_1I_1 - L_2I_2 + K_1I_1 - K_2I_2$  (5)

and
$I = I_1 + I_2$

The geometrical inductance is the conventional inductance associated with an electrical element. From symmetry and initial conditions, it is asserted that since the number of Cooper pairs $N_1$ equals the number of Cooper pairs $N_2$ the geometric inductance $L_1$ equals $L_2$. Thus, to achieve an energy minimum, current I is equally divided between legs 18 and 20 of FIG. 1 according to the constraints represented by the following equation:

$L_1I_1 + K_1I_1 = L_2I_2 + K_2I_2$  (6)

This equilibrium condition will persist as long as the values of $L_1$, $L_2$, $K_1$ and $K_2$ remain constant. It should be clear that as the constants $L_1$, $L_2$, which correspond to geometric inductance in the corresponding legs 18 and 20, and $K_1$ or $K_2$ which correspond to the kinetic inductance in the respective legs are changed, the current division; that is, the values of $I_1$ and $I_2$ will change. Practically, only the value of kinetic inductance $K_1$ and $K_2$ can be changed, since these are a function of the Cooper pair density $N_1$, and $N_2$ which can change unlike the geometrical inductances $L_1$ and $L_2$. The Cooper pair density can be changed by photons, phonons, current, or a magnetic field. The method of the present invention also includes detecting a change in the kinetic inductance of the superconducting loop in accordance with the intensity of radiant photon flux striking the exposed leg.

As further embodied, and referring to FIG. 1, current division ($I_1$ and $I_2$) occurs to minimize the energy functional E. Photoexcitations may be used to change the Cooper pair density of leg 18, for example, as shown by FIG. 1 by exposure to a radiant photon flux represented by arrows 16 of FIG. 1. Thus, if leg 18 is exposed, the value of Kinetic Inductance $K_1$ changes by a quantity referred to as $\Delta K$, thereby producing a change in the current division between leg 18 and leg 20. Since the sum of the currents $I_1$ and $I_2$ is constant, $\Delta I_1$ equals $-\Delta I_2$.  (7)

The energy functional E as previously expressed can be rewritten as $E = \frac{1}{2}L_1i_1^2 + \frac{1}{2}(K_1 + \Delta K_1)i_1^2 + \frac{1}{2}K_2i_2^2$  (8)

Differentiating this with respect to $i_1$ or $i_2$ we obtain $\frac{(\partial E)}{(\partial i_1)} = 0 = L_1i_1 - L_2i_2 + (K_1 + \Delta K_1)i_1 - K_2i_2$  (9)

Where the new current variables $i_1$ and $i_2$ are related to the initial currents by $i_1 = I_1 - \Delta I_1$ for leg 18

$i_2 = I_2 + \Delta I_2$ for leg 20  (10)

Substituting equations (10) and (7) into equation (9) and simplifying the following is obtained $[L_1 + L_2 + K_1 + K_2 + \Delta K_1]\Delta I_1 = -\Delta K_1 I_1$  (11)

For small values of $\Delta K_1$ it is clearly evident that the current $I_1$ will change by:

$\Delta I_1 = \frac{-\Delta K_1 I_1}{[L_1 + L_2 + K_1 + K_2 + \Delta K_1]}$  (12)

This can be related to the photon flux ($\phi$) where, for example, a small number of Cooper pairs $\Delta N_1$ in leg 18 have been separated by:

$$\Delta K_1 = \frac{\Delta N_1}{N_1} K_1 \qquad (13)$$

The change in the kinetic inductance $\Delta K_1$ can be related to the instantaneous quantum efficiency $\eta$, the photon flux $\phi$, the absorbing layer's thickness and lifetime $\tau$, as follows:

$$\Delta K_1 = \frac{[\eta \phi \tau]}{[\tau N_1]} \qquad (14)$$

It is clear that the photoresponse will be monotonic with the number of broken Cooper pairs. Specifically, if the number of broken pairs increases in loop 10, then the current $i_1$ will correspondingly increase. Clearly the life time ($\tau$) of the excitation will have a direct effect. Hence, the photogenerated change in current $i_1$, $\Delta I_1$ will depend directly on (a) the photon flux and (b) the D.C. current flowing through the loop 10 of FIG. 1, and (c) the lifetime ($\tau$) of the photoexcitation. Also, the signal value will vary inversely with the total inductance, including geometric and kinetic inductances. (Denominator in equation 12). An example of a readout for this detector, is a superconductor read-out loop 21 having weak links 23 inductively coupled to loop 10, which detects a change in current flowing in loop 10 caused by kinetic inductance. A semiconducting read-out circuit is also viable for reading out from the superconducting quantum detector.

The method of the present invention includes providing for minimizing the geometric inductance in the loop during injection and removal of the superconducting current.

The response of the detector 8 can be increased if the geometric inductance L is decreased. The kinetic inductance K is an integral part of the detection method, in contrast to the field or geometric inductances $L_1$ and $L_2$ which should be eliminated or made very small. Minimization of the geometric inductance is possible by effectively cancelling the current produced magnetic field about each leg of the loop of the detector. As herein embodied, preferred methods of minimizing geometric inductance are described in connection with FIGS. 1-4.

The superconductive quantum multispectral detector of the present invention included a substrate.

Figure 2:
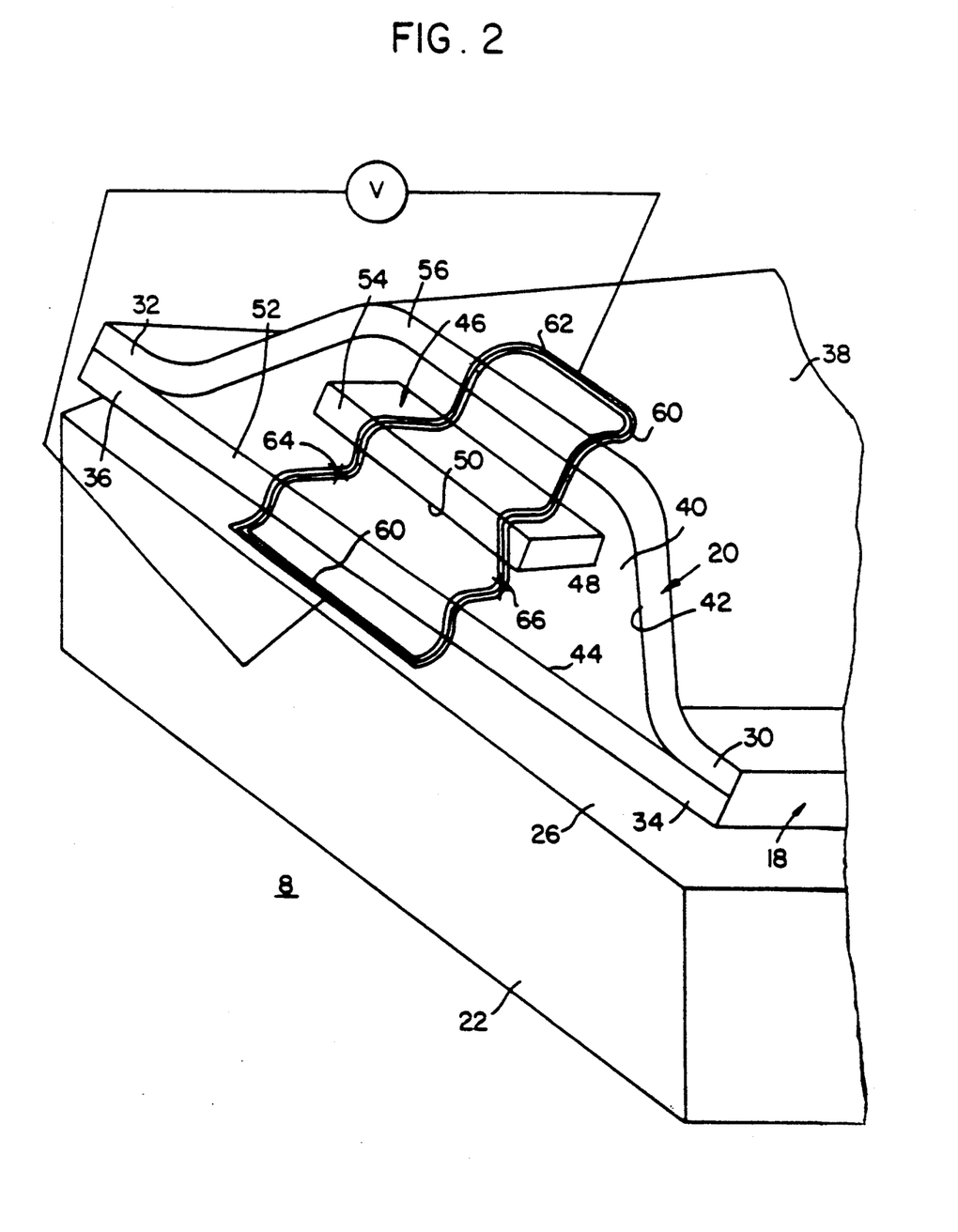
FIG. 2 is a view in perspective of an exemplary implementation of the quantum detector of the present invention.
Figure 3:
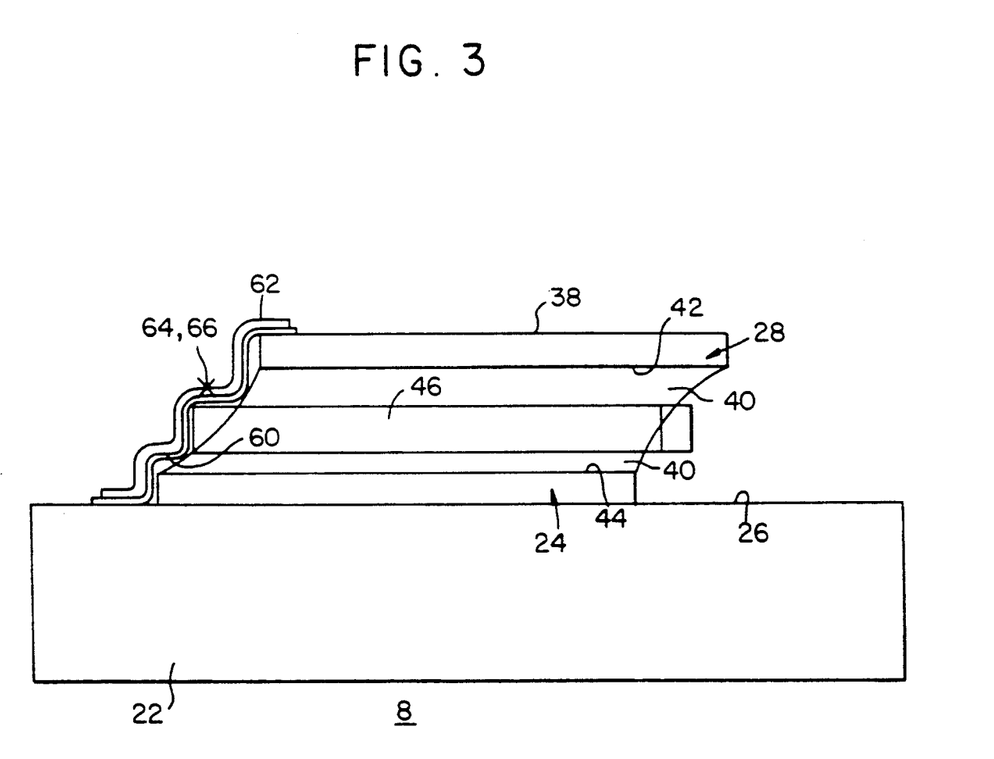
FIG. 3 is a sectional view of the detector of FIG. 2.

Referring to the embodiment illustrated in FIGS. 2 and 3, where like reference numbers refer to like parts of FIG. 1, a superconductive quantum multispectral detector 8 of the present invention comprises a substrate, generally referred to as 22, which may be made of material such as MgO, LaSrCuO, or SrTiO, for example.

In accordance with the present invention, a first thin film strip of superconductive material overlays the substrate 22 and has opposite ends defining the length thereof; and a second thin film strip of superconducting material having a central portion spaced from a central portion of the first strip with opposite ends integrally attached to opposite ends of the first strip defining first and second respective legs of a closed superconducting loop. The second leg of the closed loop is exposed to ambient.

As herein embodied and referring to FIGS. 2 and 3, thin film strip 18 is formed on surface 26 of substrate 22, and thin film strip 20 is fastened, adjacent opposite ends 30 and 32, to corresponding opposite ends 34 and 36 of superconductive thin film strip 18. Superconductive strip 20 is spaced centrally of the opposite ends 30, 34 and 32, 36 from conductive strip 18 defining superconductive loop 10 between the opposite ends thereof. Opposite ends 32, 36 and 30, 34 are electrically joined so that the loop is a completely superconducting loop; that is, such that no weak links are formed by the joining of the opposite ends. As above mentioned spaced portions of conductive strips 18 and 20 correspond to similarly referenced first and second legs of loop 10 in FIG. 1. Outer surface 38 of first leg 20 is exposed to ambient, and is utilized for receiving radiation flux. Radiant flux may be received by leg 18 and through the substrate 22 if it is more convenient for the particular application. The exposed surface area of film strip 20 defines the detecting area of the detector. Current is being injected at the 30, 34 juncture and removed at the 32, 36 juncture.

The detector of the present invention includes a region of non-superconductive material disposed in the defined loop between the first and second legs and covering opposing surfaces of the first and second legs. As herein embodied, a region of non-superconducting material 40 may be, for example PrBaCuO, or MgO Material of region 40 completely covers opposing surfaces 42 and 44 of strips 18 and 20 respectively.

In accordance with the invention, means are associated with the defined loop for minimizing the geometric inductance therein. As embodied herein, a diamagnetic thick film strip 46 has opposite surfaces 48 and 50 extending substantially parallel to opposing surfaces 42 and 44 of strips 20 and 18 respectively. Strip 46 is made from a superconductor several penetration depths in thickness, and serves as a diamagnetic strip.

Preferably, superconductor strips 18 and 20 may range in thickness between 200 to 1300 Angstroms, or more specifically equal to or less than the penetration depth thickness value of each strip 18 and 20. Magnetic field penetration depth is a parameter that corresponds to the distance from the surface of a superconductor that a magnetic field penetrates at low fields. Diamagnetic strip 46, which serves as a ground plane, is thicker than strips 18 and 20 of the superconductive loop in order to effectively eliminate the effect of geometric inductance in the legs 18 and 20 of the loop. Preferably, the thickness of diamagnetic ground plane 46 is at least 2 penetration depths, and which is preferably in the neighborhood of approximately 3/10th to 1 micron thick. Although, the detector of the present invention is operable without diamagnetic strip 46, the inclusion of the ground plane renders the detector fifty to one hundred times more sensitive. It should be noted that edges 52, 54 and 56 of strip 18, 46, and 20 are exposed in that they can be covered by a squid circuit.

The present invention, includes read-out means which are inductively coupled to the defined loop for detecting the photogenerated magnetic field output signal corresponding to the intensity of the radiant photon flux striking the defined loop. An insulated film overlays at least a portion of the loop to isolate the inductive coupled read-out circuit from the detector.

According to one aspect of the present invention, a superconductive quantum interference loop (SQUID) having a pair of weak links overlays the insulative layer and is inductively coupled to the first and second strips for outputting a voltage as a function of the circulating superconductive current, induced by depairing Cooper pairs in the exposed leg of the loop. As herein embodied, an insulative film 60 thin insulating layer is formed to extend over the exposed edges of the first and second strips and diamagnetic strip, over which is formed a superconductive readout loop 62 that has a weak link 64 and 66 in each branch thereof. Insulative film 60 should be as thin as possible, preferably approximately 1000 Angstroms. Superconducting loop 62 may be of any superconducting material as heretofore described; and weak links 64 and 66 may be any conventional type. It is noted that in FIGS. 2 and 3 the first, second and diamagnetic superconductive strips are laterally stepped slightly, and the SQUID is formed on the stepped portion. The reason for the stepped construction in FIG. 2 of the present embodiment is to render it easier to form the SQUID in inductive relationship to the superconductive loop.

Figure 4:
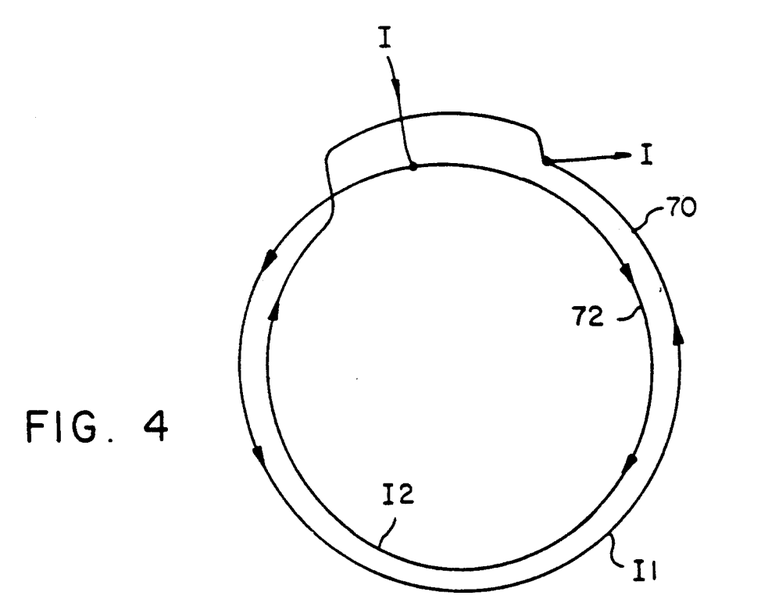
FIG. 4 diagrammatically illustrates an alternate method of minimizing the effect of geometric inductance.

In operation, SQUID 62 senses the total circulating superconducting current in legs 18 and 20 of loop 10, and, the magnetic field produces a voltage across weak links 64, 66 thereby changing the output voltage across the ends of SQUID 62. A highly sensitive voltmeter may be connected across SQUID 62 to detect this change in voltage, which of course corresponds to the radiant photon flux impinging on leg 20 of the detector. As previously discussed, the geometric inductance present in each loop 18 and 20 is significantly reduced by placing the superconducting diamagnetic strip 46 between the legs of loop 10 as shown in FIG. 3. Such a ground plane, reduces the detectors geometric inductance to approximately less than 5% of the original value. This also offers an additional benefit of reducing the likelihood of flux trapping in the detector's loop. It should be pointed out, however, and referring to FIG. 4, an alternate way of reducing the geometric inductances in loop 8 is by using transformer geometry. Flowing currents $I_1$ and $I_2$ may be used to cancel each others' geometric inductance by a proper geometrical configuration. For example, FIG. 4 illustrates two overlapping loops 70 72, where the current $I_1$ in loop 70 flows in a different direction than the current $I_2$ in loop 72. This 180° mutual inductance coupling, cancels the geometric inductance. Thus, the reduction in geometric inductance in each loop and acts to reduce the total inductance and maximizes the response as follows:

$$\Delta I_1 = \frac{-\Delta K_1 I_1}{[(L_2 - M_1) + (L_2 - M_2) + K_1 + K_2 + \Delta K_1]} \quad (15)$$

Mutual inductance $M_1$ and $M_2$ should be almost equal to the total geometric inductance $L_1$ and $L_2$ respectively, for maximizing the responsiveness of the detector.

Figure 5:
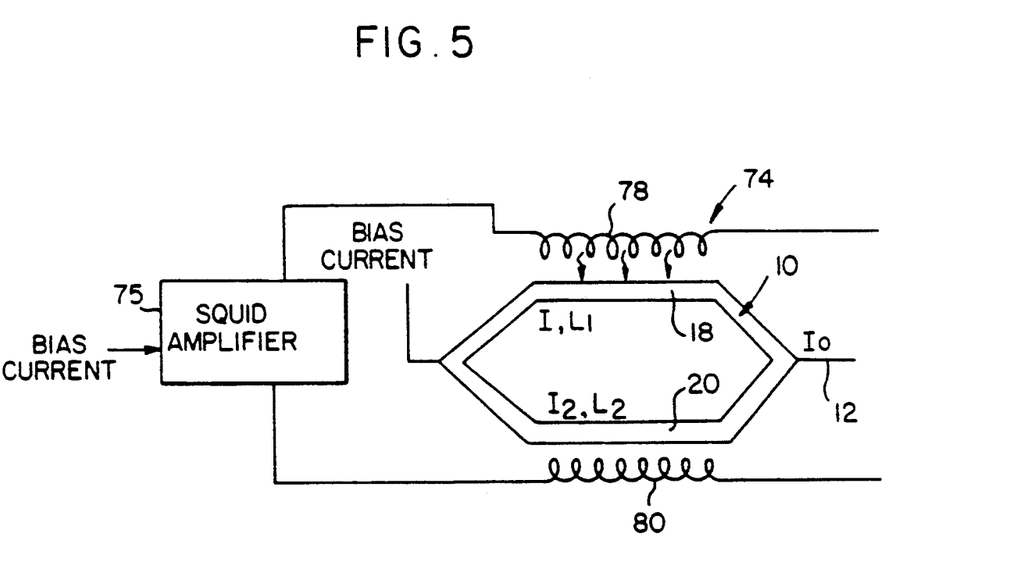
FIG. 5 diagrammatically illustrates an alternate method of reading out the detected radiant energy.

Referring to FIG. 5, another arrangement for reading out the change in current in loop 10 is illustrated. With this arrangement, the current in loop 10 is coupled by transformer 74 to a SQUID amplifier 75. Superconducting transformer 74 having series connected secondary windings 78 and 80 is inductively coupled to loop 10. Legs 18 and 20 of loop 10 serves as primary windings. An increase in radiant photon flux on leg 20 causes a drop in current through leg 18. Since secondary windings 78 and 80 are in bucking relationship, a change in current in winding 78 and 80 is the sum of the absolute value of the changes in current in each leg or just proportional to the net circulating current in loop 10. Thus, the current in the secondary winding 78 is a function of the radiant photon flux on leg 20 of superconducting loop 10 which causes a change in current flow in legs 18 and 20. With the proper detector bias current $I_2$, the current in the secondary windings should be primarily an A/C photocurrent only. Secondary windings 78 and 80 may be coupled to conventional SQUID amplifier 75, which in turn may be connected to an A/D converter, for example.

Figure 6:
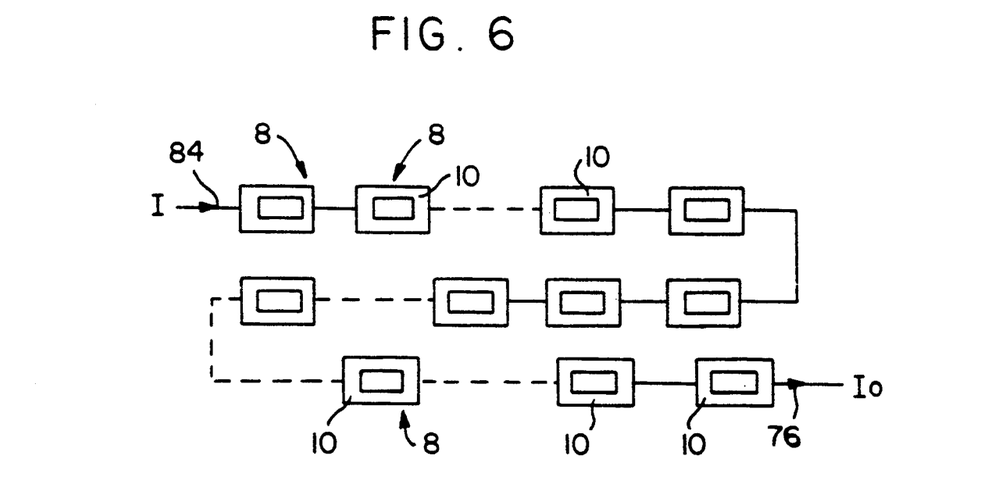
FIG. 6 is a diagram illustrating an array of superconductive loops of the present invention.

To form an array as shown in FIG. 6, a plurality of individual detectors 8 are series connected. Superconducting current is injected at 84 and extracted at 76. Read-out superconductors, such as 21 or 62 (not shown) are similarly coupled to each loop detector designated by 10.

It will be apparent to those skilled in the art that various modifications in variations can be made in the multispectral superconductive detector of the present invention and in the construction of the readout circuitry associated therewith without departing from the scope and spirit of the invention. Thus, it is intended that the present invention cover the modifications and variations of this invention provided they come within the scope of the appended claims and their equivalents.

I claim:
1. A superconducting quantum multispectral detector, comprising:
    a substrate,
    a first thin film strip of superconductive material overlaying the substrate having opposite ends defining a predetermined length;
    a second thin film strip of superconductive material having a central portion spaced from a central portion of the first strip and having opposite ends integrally attached to the opposite ends of the first strip, the spaced first and second strips defining first and second legs respectively of a closed superconductive loop, the second leg of the closed loop being exposed to ambient photon radiation, said loop being operable in response to the intensity of said ambient photon radiation to change circulating current flowing in the loop, said current representing the change in the kinetic inductance produced by depairing of Cooper pairs and to produce a magnetic field in accordance with the flow of superconducting direct current in the loop; and
    read-out means, spaced from and inductively coupled to the defined loop, responsive to the magnetic field for outputting a signal corresponding to the intensity of photon flux striking the exposed second leg.

2. The detector of claim 1 wherein the first and second defined legs of the loop each having a thickness no greater than the magnetic penetration depth of said superconductive material comprising said legs of said loop.

3. The detector of claim 1 wherein the first and second defined legs of the loop each have a thickness in the range of from about 200 to about 1300 Angstroms.

4. The detector of claim 1 wherein the means for minimizing geometric inductance in the loop comprises a diamagnetic strip of superconductive material spaced from the first and second legs of the defined loop.

5. The detector of claim 4 wherein the inductively coupled read-out means comprises an insulative film overlaying at least a portion of exposed edges of the first and second and third strips; and a superconductive quantum interference loop having a pair of weak links overlaying the insulative layer and magnetically coupled to the first and second strips, for outputting a voltage as a function of circulating current produced by the photo induced changes in the kinetic inductance in the second leg of the loop.

6. The detector of claim 4 wherein the diamagnetic strip of superconductive material has a thickness corresponding to a plurality of magnetic penetration depths.

7. The detector of claim 4 wherein the diamagnetic strip of superconductive material is in the range of approximately 3/10th of a micron to 1 micron in thickness.

8. The detector of claim 1 further comprising a region of non-superconductive material disposed in the defined area between the first and second legs and covering opposing surfaces of the first and second legs.

9. The detector of claim 1 wherein the read-out means comprises a superconducting transformer utilizing the superconductive loop as a primary winding, and having a secondary winding, said primary winding being biased by a constant current source and coupled to the secondary winding in a bucking relationship, said primary winding current induced in the secondary winding providing a differential current from each detector leg thereby providing a signal proportional to the net circulating current in the detection loop.

10. The detector of claim 8 wherein the nonsuperconductive material has a thickness between opposite surfaces of the diamagnetic strip and each respective leg of the loop in the range of approximately 1,000 to about 5,000 Angstroms.

11. The detector of claim 4 wherein the diamagnetic strip of superconductive material is at least two magnetic field penetration depths in thickness.

12. A superconductive quantum multispectral detector, comprising
a substrate;
a first thin film strip of superconductive material overlaying the substrate having opposite ends defining a predetermined length;
a second thin film strip of superconductive material having a central portion spaced from a central portion of the first strip and having opposite ends integrally attached to the opposite ends of the first strip, the spaced first and second strips defining first and second legs respectively of a closed superconductive loop, the second leg of the closed loop being exposed to ambient photon radiation, said loop being operable in response to the intensity of said ambient photon radiation to change circulating current flowing in the loop, said current representing the change in the kinetic inductance produced by depairing of Copper pairs and to produce a magnetic field in accordance with the flow of superconducting current through the loop;
means for minimizing geometric inductance in the loop comprises a diamagnetic strip of superconductive material spaced from and between the first and second legs of the defined loop; and
read-out means, inductively coupled to the defined loop, responsive to the magnetic field for outputting a signal corresponding to the intensity of photon reflux striking the exposed second leg.

* * * * *